United States Patent [19]

Kitada et al.

[11] Patent Number: 4,663,607

[45] Date of Patent: May 5, 1987

[54] MAGNETORESISTIVE ELEMENT

[75] Inventors: Masahiro Kitada, Nishitama; Hideo Tanabe, Hachioji; Noboru Shimizu, Tokorozawa; Hiroshi Tsuchiya, Naka; Masao Katsumata, Odawara, all of Japan

[73] Assignee: Hitachi, Ltd., Tokyo, Japan

[21] Appl. No.: 737,873

[22] Filed: May 28, 1985

[30] Foreign Application Priority Data

May 29, 1984 [JP] Japan .................................. 59-107585

[51] Int. Cl.$^4$ ............................................. H01L 43/04
[52] U.S. Cl. ................................ 338/32 H; 338/32 R; 360/113
[58] Field of Search ............. 338/4, 32 R, 32 H, 32 S; 360/110–113, 126; 148/31.55, 31.57

[56] References Cited

U.S. PATENT DOCUMENTS

| 4,217,783 | 8/1980 | Ito et al. | 338/4 X |
| 4,242,710 | 12/1980 | Hempstead et al. | 360/113 |
| 4,566,050 | 1/1986 | Beam et al. | 338/32 R X |

Primary Examiner—E. A. Goldberg
Assistant Examiner—M. M. Lateef
Attorney, Agent, or Firm—Antonelli, Terry & Wands

[57] ABSTRACT

A magnetroresistive element formed by laminating a plurality of metallic magnetoresistance effect films having magnetostriction of different signs on a substrate. The magnetoresistive element can be formed to exhibit zero magnetostriction or to exhibit magnetostriction of any desired value. Further, the magnetoresistive element exhibits magnetostriction that changes little with the change in the film composition. The metallic magnetoresistance effect films preferably have positive and negative magnetostriction with an absolute value not greater than $15 \times 10^{-6}$.

18 Claims, 6 Drawing Figures

MAGNETORESISTIVE ELEMENT

BACKGROUND OF THE INVENTION

The present invention relates to a magnetoresistive element utilizing the magnetoresistance effect, and particularly to a magneto-resistive element that can be well adapted to a sensor for detecting a magnetic field and to a magnetic head.

In a conventional magnetoresistive element utilizing an Ni-Fe alloy (a so-called permalloy) film having high permeability, the magnetic characteristics are subject to change depending upon the materials constituting the element and stress exerted in using the element. In order to prevent the magnetic characteristics from changing, therefore, a permalloy film having a composition of zero magnetostriction has heretofore been used. However, the composition range in which the magnetostriction of the permalloy film remains zero is very narrow. With a thin film formed by evaporation or sputtering, in particular, it is difficult to precisely control composition. Moreover, the magnetostriction of permalloy film varies greatly depending upon the kind and amount of impurity elements contained in the film. Accordingly, electromagnetic properties of the element change depending upon stress.

The following references are cited to show the state of the art: (i) A. V. Pohm, C. S. Comstock and L. Perrey; IEEE Trans. Mag., MAG-20, No. 5, 863 (1984), and (ii) J. A. C. van Ooyen, M. F. Druyvesteyn and L. Postma; J. Appl. Phys., 53(3), 2596 (1982).

SUMMARY OF THE INVENTION

The object of the present invention is to provide a magnetoresistive element which is free from the defects inherent in the conventional art, and which exhibits very little change in its electromagnetic properties even when stress is exerted thereon, or to provide a magnetoresistive element which exhibits stable magnetostriction of a predetermined value.

In order to achieve the above object, the magnetoresistive element of the present invention comprises a predetermined nonmagnetic and insulating substrate, and a multilayer film which is formed by alternately laminating a metallic magnetoresistance effect film having a predetermined thickness and a predetermined positive magnetostriction and a metallic magnetoresistance effect film having a predetermined thickness and a predetermined negative magnetostriction.

It is possible to obtain a magnetoresistive element which exhibits very little change in its electromagnetic properties when the stress is exerted thereon, by the methods described below. That is, when the layers in the multilayer film have an equal thickness, a multilayer film is obtained by alternately laminating an equal number of metallic magnetoresistance effect films that have magnetostrictions of opposite signs and that have composition such that the absolute values thereof are the same or are different by a predetermined amount. When the layers in the multilayer film have different thicknesses, thicknesses of layers and the number of layers laminated are so adjusted that the amount of magnetostriction of layers having magnetostriction of different signs is compensated by a predetermined positive or negative value.

To obtain a magnetoresistive element having magnetostriction of a predetermined value other than zero, furthermore, the thicknesses of layers, magnetostriction, and the number of layers laminated should be so combined as not to fall within the range of conditions that reduce the value of magnetostriction to zero. Specifically, these conditions can be desirably determined experimentally in advance for each case.

Each layer constituting the multilayer film should have a thickness greater than 10 angstroms, and the resultant thickness of the layers, i.e., the thickness of the multilayer film should be less than 1000 angstroms. A layer having a thickness of smaller than 10 angstroms is not capable of exhibiting spontaneous magnetization, and is not desirable. As is widely known, furthermore, the conventional magnetoresistance effect film exhibits its effects sufficiently when its thickness is not greater than 1000 angstroms. According to the present invention, similarly, the multilayer film employed for the magnetoresistive element should have a thickness that is not greater than 1000 angstroms. When a multilayer film is used for those applications where the magnetoresistance effect is not expected, however, the thickness of the multilayer film may exceed 1000 angstroms.

Each of the metallic magnetoresistance effect films constituting the multilayer film should have an absolute value of magnetostriction which is not greater than $15 \times 10^{-6}$. This is because, a metallic magnetoresistance effect film having an absolute value of magnetostriction which is greater than $15 \times 10^{-6}$, produces a very small output voltage which is based upon the magnetoresistance effect in the magnetic field. When the magnetostriction is less than $-15 \times 10^{-6}$, in particular, the output voltage drops strikingly.

The substrate may be composed of any material such as glass, $SiO_2$, $Al_2O_3$, $MgO$, silicon, or a material obtained by laminating $SiO_2$ on silicon, provided that it is nonmagnetic, electrically insulating, and can withstand the step of adhering with a metallic magnetoresistance effect film.

The metallic magnetoresistance effect films that constitute the multilayer film can be adhered by a method that is capable of forming a film of a desired thickness, such as evaporation, sputtering, electroplating, ion-beam evaporation, or ion-beam sputtering method.

DESCRIPTION OF THE PREFERRED EMBODIMENTS

Reference Example

For reference, a conventional metallic magnetoresistance effect single film was prepared to examine its characteristics.

Figure 1:
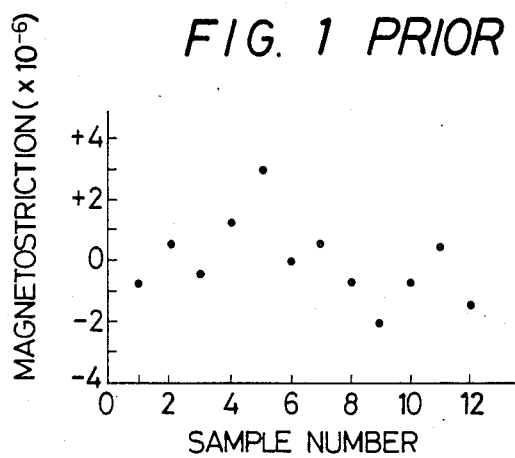
FIG. 1 is a graph showing dispersion in the magnetostriction of a conventional permalloy film.

FIG. 1 illustrates measured results of magnetostriction of a plurality of samples consisting of an Ni-19% Fe alloy film (percent is all by weight hereinafter) that is deposited on a glass substrate maintained at 200° C. to a thickness of 400 angstroms by the electron-beam evaporation method, and that is considered to have a composition of zero magnetostriction. The films were continuously formed on different substrates from the same source of evaporation and under the same conditions of evaporation. Thickness of the evaporated film was measured by a film-thickness monitor that employed a quartz oscillator. The degree of magnetostriction was determined from the relation between the change in the magnetic field-voltage curve and applied stress, by measuring the magnetic field-voltage curve of magnetoresistance effect characteristics in the alternating magnetic field while applying a predetermined stress to the sample. Magnetostriction was also measured in the same manner in the working examples appearing later.

As will be obvious from FIG. 1, considerable dispersion develops in magnetostriction even when the film is evaporated under uniform conditions, and it is very difficult to reliably obtain a permalloy (Ni-Fe alloy) film having zero magnetostriction. The cause is attributed to that the composition of permalloy film changes depending upon delicate evaporation conditions such as evaporation rate, substrate temperature, and degree of vacuum in the evaporation chamber. Specifically, the cause is attributed to, for example, two factors: (i) nickel and iron establish different vapor pressure; therefore, a different number of nickel atoms and iron atoms are evaporated from the source of evaporation depending upon the initial stage and last stage of evaporation, and (ii) the kind and content of impurities in the film vary depending upon evaporation conditions such as the effect of oxygen.

Figure 2:
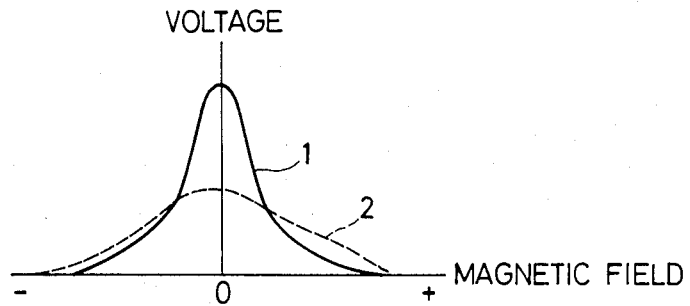
FIG. 2 is a graph showing magnetoresistance effect characteristics (magnetic field-voltage characteristics) of a conventional evaporated permalloy film with stress as a parameter.

FIG. 2 shows magnetic field-voltage characteristics of a sample having magnetostriction of $-2.2\times10^{-6}$, which is one of the conventional permalloy film samples shown in FIG. 1. In FIG. 2, a curve 1 represents characteristics of a sample consisting of a glass substrate on which a permalloy film is evaporated, and a curve 2 represents characteristics of a sample consisting of a glass substrate on which a permalloy film is evaporated and on which a stress of about 500 kg/cm² is exerted. Application of stress causes the voltage to drop drastically. This is due to magnetostriction of the permalloy film. In FIG. 2, the ordinate and abscissa represent quantities in arbitrary units.

The magnetic field-voltage characteristics are measured by applying a uniform alternating magnetic field to a rectangular metallic magnetoresistance effect film in the direction of the short axis thereof, flowing a constant current into the film through aluminum conductors provided at both ends of the magnetoresistance effect film in the lengthwise direction thereof, and measuring the change of resistance of the film depending upon the magnetic field as the change of terminal voltage across the aluminum conductors. Therefore, the magnetic field-voltage characteristics can be regarded as output voltage characteristics of the magnetoresistive element. Further, the stress is a tensile stress applied in the lengthwise direction of the magnetoresistance effect film. The method of measuring magnetic field-voltage characteristics and the method of applying stress are also the same in the working examples described below.

EXAMPLE 1

Figure 3:
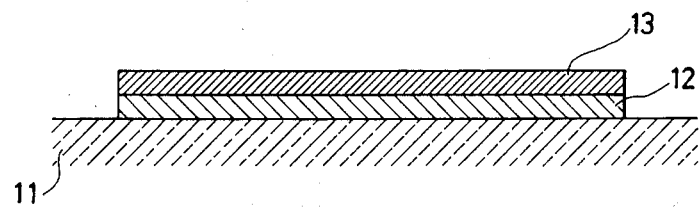
FIG. 3 is a section view showing a magnetoresistive element according to an embodiment of the present invention

The magnetoresistive element comprises, as shown in FIG. 3, two layers, i.e., an Ni-21% Fe layer 12 having positive magnetostriction ($+3\times10^{-6}$) and an Ni-17% Fe layer 13 having negative magnetostriction ($-3\times10^{-6}$) that are continuously evaporated on a glass substrate 11 to a thickness of 200 angstroms respectively. FIG. 3, however, does not show aluminum conductors that serve as terminals for supplying current. The aluminum conductors are not shown, either, in the embodiments of FIGS. 5 and 6.

Figure 4:
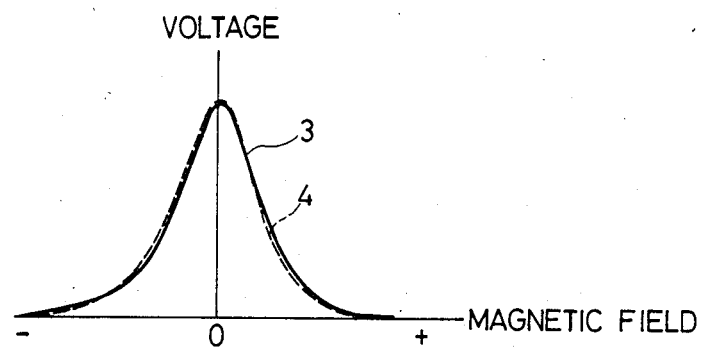
FIG. 4 is a graph showing magnetoresistance effect characteristics (magnetic field-voltage characteristics) of a magnetoresistive element according to an embodiment of the present invention with stress as a parameter.

FIG. 4 is a diagram showing magnetic field-voltage characteristics of a magnetoresistance effect film of this embodiment measured in the same manner as the above-mentioned Reference Example, wherein a curve 3 (solid line) represents characteristics of a sample consisting of a glass substrate on which the permalloy films are evaporated, and a curve 4 (dotted line) represents characteristics of a sample consisting of a glass substrate on which the permalloy films are evaporated and on which stress is exerted, the ordinate and abscissa representing quantities in arbitrary units. Stress was applied in the same manner as in the above-mentioned Reference Example. As will be obvious from FIG. 4, the curve 3 and the curve 4 are within a range of measurement errors, and the magnetic field-voltage characteristics are not changed by the application of stress. Though it is not clear why the magnetic field-voltage characteristics are not affected by the stress, it is presumed that when thin magnetic films having different magnetostrictive characteristics are brought into contact with each other they create electromagnetic interaction, so that positive and negative magnetostriction cancel each other.

According to the magnetoresistive element of this embodiment, furthermore, magnetostriction changes by $0.2\times10^{-6}$ or less even when the composition of magnetoresistance effect film is changed as much as 1.5% by weight, which is a remarkable reduction in the variation of the magnetostriction compared with the conventional element.

EXAMPLE 2

Figure 5:
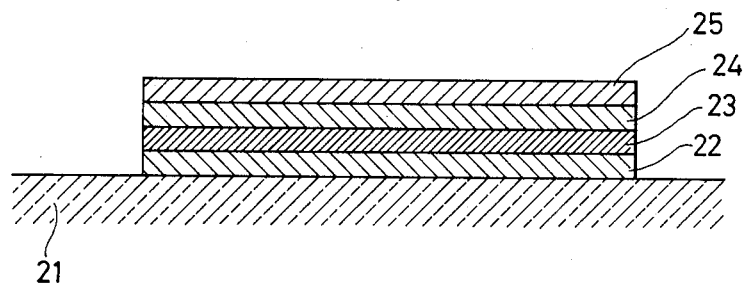
FIG. 5 is a section view showing a magnetoresistive element according to another embodiment of the present invention.

FIG. 5 is a section view showing a magnetoresistive element having a permalloy film with a total thickness of 400 angstroms obtained by continuously evaporating a total of four layers, i.e., two Ni-21% Fe layers 22, 24 and two Ni-17% Fe layers 23, 25, each having a thickness of 100 angstroms, onto a glass substrate 21 in the same manner as that of Example 1. Even when stress was exerted, the magnetoresistive element exhibited no change in the magnetic field-voltage characteristics as measured in the same manner as in Example 1. Further, even when the film composition was changed, the change in the value of magnetostriction was the same as that of Example 1. It was also found that when many magnetoresistance effect films having positive and negative magnetostriction of nearly an equal absolute value were laminated, the effects were similar to those of Example 1.

EXAMPLE 3

Figure 6:
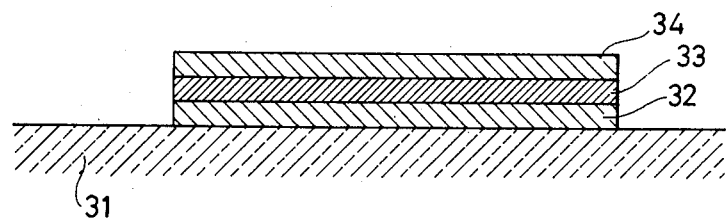
FIG. 6 is a section view showing a magnetoresistive element according to a further embodiment of the present invention.

A maximum magnetoresistance effect is exhibited by an Ni-Fe alloy having about 10% Fe which, however, exhibits great magnetostriction and is not utilizable as a magnetoresistive element. The effect of magnetostriction can be reduced by laminating an Ni-10% Fe layer having negative magnetostriction (about $-15 \times 10^{-6}$) and Ni-24% Fe layer having positive magnetostriction (about $+7 \times 10^{-6}$). That is, a three-layer film consisting of 150 angstroms thick Ni-24% Fe layers 32, 34, and a 150 angstroms thick Ni-10% Fe layer 33 sandwiched therebetween, being laminated on a glass substrate 31 as shown in FIG. 6, exhibited no change in magnetic field-voltage characteristics even when stress was applied thereto. That is, even when magnetic films having different absolute values of magnetostriction are laminated, the effect of magnetostriction could be compensated by increasing the total thickness of magnetic films of the side having small absolute values.

In this embodiment, evaporation conditions and the conditions for applying stress were the same as those of Example 1.

Further, the change in the value of magnetostriction relative to the change in the film composition, was small as in Examples 1 and 2.

The element of this embodiment exhibits magnetoresistance effect which is less by about 10% than that of when the Ni-10% Fe film is used alone, but which is greater by about 20% than that of when the conventional Ni-19% Fe film is used, and further offers advantages as described above.

EXAMPLE 4

The effects similar to those of Examples 1 and 2 were also exhibited by a multilayer film consisting of dissimilar magnetic materials, i.e., consisting of a Co-55% Ni alloy layer having positive magnetostriction (about $+15 \times 10^{-6}$) and an Ni-10% Fe alloy layer having negative magnetostriction (about $-15 \times 10^{-6}$) each having a thickness of 200 angstroms.

In this Example, the structure, film evaporation conditions and the method of measuring characteristics were the same as those of Examples 1 and 2, except for the film composition.

EXAMPLE 5

Examples 1 to 4 have utilized the compensation effect relying upon positive and negative magnetostriction to accomplish zero magnetostriction. Depending upon the purpose, however, magnetostriction should be positive or negative. Positive or negative magnetostriction can be obtained by alternately laminating a metallic magnetoresistance effect film having positive magnetostriction and a metallic magnetoresistance effect film having a negative magnetostriction. For instance, a double-layer film consisting of an Ni-25% Fe layer having magnetostriction of $+8 \times 10^{-6}$ deposited to a thickness of 200 angstroms on a glass substrate, and an Ni-17% Fe layer having magnetostriction of $-3 \times 10^{-6}$ deposited thereon to a thickness of 200 angstroms, exhibits a magnetostriction of $+2 \times 10^{-6}$. It is also possible to prepare a synthesized film that exhibits negative magnetostriction. In the synthesized film, however, change in the magnetostriction becomes less sensitive relative to the film composition due to the compensation effect that results from the interaction among the layers having different magnetostriction. Therefore, the magnetostriction of the synthesized film is not determined by simple addition or subtraction of absolute values of magnetostriction of the individual layers; i.e., it is necessary to use the layers having magnetostrictions which are more different from each other than simply calculated. Therefore, magnetostriction and the thickness of each layer is desirably determined through experiments for each case.

The magnetoresistive element of this Example exhibited the desired magnetostriction as described above, exhibited no change in the magnetic field-voltage characteristics even when the stress was applied thereto, and exhibited a change of magnetostriction of $0.2 \times 10^{-6}$ or less for a change in film composition of 1.5% as in Examples 1 to 4, said change being remarkably smaller than that of a conventional element.

In this Example, the structure, film evaporation conditions and the method of measuring characteristics were the same as those of Example 1, except for film composition.

By laminating magnetic layers having magnetostrictions of different signs in a multiple construction as described above, it is possible to suitably adjust the value of the magnetostriction of the synthesized film. By synthesizing the film, furthermore, the change in magnetostriction can be reduced relative to the change in film composition. In a conventional single permalloy film having a composition of zero magnetostriction, for instance, magnetostriction changes by a value of $1 \times 10^{-6}$ relative to the change of 0.5% by weight in the composition. With a multilayer film obtained by laminating a permalloy layer having magnetostriction of $+6 \times 10^{-6}$ and a permalloy layer having magnetostriction of $-6 \times 10^{-6}$ according to the present invention, the change of magnetostriction of the synthesized layers is less than $0.2 \times 10^{-6}$ relative to the change of 1.5% by weight of the composition. Similar results have been obtained in the aforementioned Examples. That is, by using the multilayer film of the present invention, the tolerance limits in the composition can be substantially increased by more than about 10 times compared with the conventional single layers.

In the foregoing were described the cases where the invention was adapted to Ni-Fe and Ni-Co alloys. In addition to such thin crystalline metal films, however, the invention can also be adapted to adjusting the magnetostriction of thin amorphous metal films such as of Co-Nb alloy, Co-Zr alloy, Co-W alloy and like alloys.

According to the present invention as explained above, change of electromagnetic properties based upon the magnetostriction of a magnetoresistance effect film having great dependency upon the composition thereof or impurities contained therein, can be markedly reduced by laminating magnetic films that such compositions as to exhibit magnetostrictions having different signs. Therefore, a magnetoresistive element employing the multilayer film of the present invention exhibits very little change in the element characteristics even when stress is exerted thereon. Therefore, the present invention makes it possible to provide a magnetoresistive head that exhibits stable characteristics when used for a variety of magnetic recording apparatus.

As for matters that are not described in this specification, conventional knowledge in the subject field of art can be referred to in connection with the magnetoresistive element of the present invention.

Obviously many modifications and variations of the present invention are possible in the light of the above teachings. It is therefore to be understood that within the scope of the appended claims, the invention may be practiced otherwise than as specifically described.

What is claimed is:

1. A magnetoresistive element comprising a predetermined nonmagnetic and insulating substrate, and a multilayer film which is formed by alternately laminating a metallic magnetoresistance effect film having a predetermined thickness and a predetermined positive magnetostriction and a metallic magnetoresistance effect film having a predetermined thickness and a predetermined negative magnetostriction.

2. A magnetoresistive element according to claim 1, wherein each of said metallic magnetoresistance effect films have positive and negative magnetostriction with an absolute value not greater than $15 \times 10^{-6}$.

3. A magnetoresistive element according to claim 1, wherein each of said metallic magnetoresistance effect films having positive and negative magnetostriction is 10 angstroms or more in thickness, and said multilayer film is 1000 angstroms or less in thickness.

4. A magnetoresistive element according to claim 2, wherein each of said metallic magnetoresistance effect films having positive and negative magnetostrictions is 10 angstroms or more in thickness, and said multilayer film is 1000 angstroms or less in thickness.

5. A magnetoresistive element according to claim 1, wherein magnetostriction of the multilayer film is substantially zero.

6. A magnetoresistive element according to claim 5, wherein said multilayer film is formed by alternately laminating an equal number of metallic magnetoresistance effect films that have an equal thickness and an equal absolute value of magnetostriction but whose magnetostriction has opposite signs.

7. A magnetoresistive element according to claim 6, wherein said metallic magnetoresistance effect films have positive and negative magnetostriction of not greater than $15 \times 10^{-6}$ in absolute value, each of said magnetoresistance effect films is greater than 10 angstroms in thickness, and said multilayer film is 1000 angstroms or less in thickness.

8. A magnetoresistive element according to claim 5, wherein said multilayer film is a three layer film formed by laminating a first metallic magnetoresistance effect film having a predetermined thickness and a predetermined magnetostriction between two other metallic magnetoresistance films each having a predetermined thickness and each having a predetermined magnetostriction of opposite sign than the magnetostriction of said first metallic magnetoresistance effect film.

9. A magnetoresistive element according to claim 8, wherein said metallic magnetoresistance effect films have positive and negative magnetostriction of not greater than $15 \times 10^{-6}$ in absolute value, each of said magnetoresistance effect films is greater than 10 angstroms in thickness, and said multilayer film is 1000 angstroms or less in thickness.

10. A magnetoresistive element according to claim 9, wherein said metallic magnetoresistance effect films are of equal thickness.

11. A magnetoresistive element according to claim 8, wherein said first metallic magnetoresistance effect film is a film of a Ni-Fe alloy having about 10% Fe.

12. A magnetoresistive element according to claim 11, wherein each of said two other metallic magnetoresistance effect films is a film of a Ni-Fe alloy having about 24% Fe.

13. A magnetoresistive element according to claim 1, wherein magnetostriction of the multilayer film is positive.

14. A magnetoresistive element according to claim 1, wherein magnetostriction of the mutlilayer film is negative.

15. A magnetoresistive element according to claim 1, wherein said metallic magnetoresistance effect films are films of a material selected from the group consisting of Ni-Fe alloys, Ni-Co alloys, Co-Nb alloys, Co-Zr alloys and Co-W alloys.

16. A magnetoresistive element according to claim 6, wherein said metallic magnetoresistance effect film having a positive magnetostriction is a film of Co-Ni alloy having about 55% Ni and said metallic magnetoresistance effect film having a negative magnetostriction is a film of a Ni-Fe alloy having about 10% Fe.

17. A magnetoresistive element according to claim 6, wherein said multilayer film is formed by alternately laminating two metallic magnetoresistance effect films having a positive magnetostriction with two metallic magnetoresistance effect films having a negative magnetostriction.

18. A magnetoresistive element according to claim 1, wherein said metallic magnetoresistance effect films of said multilayer film are stacked on each other.

* * * * *